(12) United States Patent
Moreschi

(10) Patent No.: US 11,196,453 B2
(45) Date of Patent: Dec. 7, 2021

(54) HIGH-POWER HYBRID SPDT SWITCH

(71) Applicant: SKYWORKS SOLUTIONS, INC., Irvine, CA (US)

(72) Inventor: Stephen Richard Moreschi, Peabody, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 17/095,842

(22) Filed: Nov. 12, 2020

(65) Prior Publication Data

US 2021/0152208 A1 May 20, 2021

Related U.S. Application Data

(60) Provisional application No. 62/937,303, filed on Nov. 19, 2019.

(51) Int. Cl.
*H04B 1/44* (2006.01)
*H03K 17/567* (2006.01)
*H03H 7/25* (2006.01)

(52) U.S. Cl.
CPC ............ *H04B 1/44* (2013.01); *H03H 7/255* (2013.01); *H03K 17/567* (2013.01)

(58) Field of Classification Search
CPC ......... H04B 1/44; H03H 7/255; H03K 17/567
See application file for complete search history.

(56) References Cited

U.S. PATENT DOCUMENTS

| | | | | |
|---|---|---|---|---|
| 5,054,114 A | * | 10/1991 | Erickson | H04B 1/48 455/78 |
| 5,442,812 A | * | 8/1995 | Ishizaki | H01P 1/15 333/104 |
| 5,789,995 A | * | 8/1998 | Minasi | H04B 1/48 333/103 |
| 7,391,283 B2 | * | 6/2008 | Kearns | H01P 1/15 333/103 |
| 9,787,305 B2 | * | 10/2017 | Liu | G05F 3/08 |
| 9,966,987 B2 | * | 5/2018 | Notargiacomo | H04B 1/48 |
| 2002/0180510 A1 | * | 12/2002 | Tamura | H04B 1/48 455/78 |
| 2010/0265004 A1 | * | 10/2010 | Suzuki | H01P 5/02 333/103 |

* cited by examiner

*Primary Examiner* — Dinh T Le
(74) *Attorney, Agent, or Firm* — Lando & Anastasi, LLP

(57) ABSTRACT

A switch assembly includes a PIN diode connected between an antenna port and a receive port, a first shunt FET device connected between the receive port and ground, a first series FET device connected between the antenna port and a transmit port, a second shunt FET device connected between the transmit port and ground, and a plurality of bias control contacts configured to receive a corresponding plurality of bias control voltages to forward bias the first shunt FET device and the first series FET device into an ON state and to reverse bias the PIN diode and the second shunt FET device into an OFF state in a transmit mode, and to reverse bias the first shunt FET device and the first series FET device into the OFF state and to forward bias the PIN diode and the second shunt FET device into the ON state in a receive mode.

20 Claims, 5 Drawing Sheets

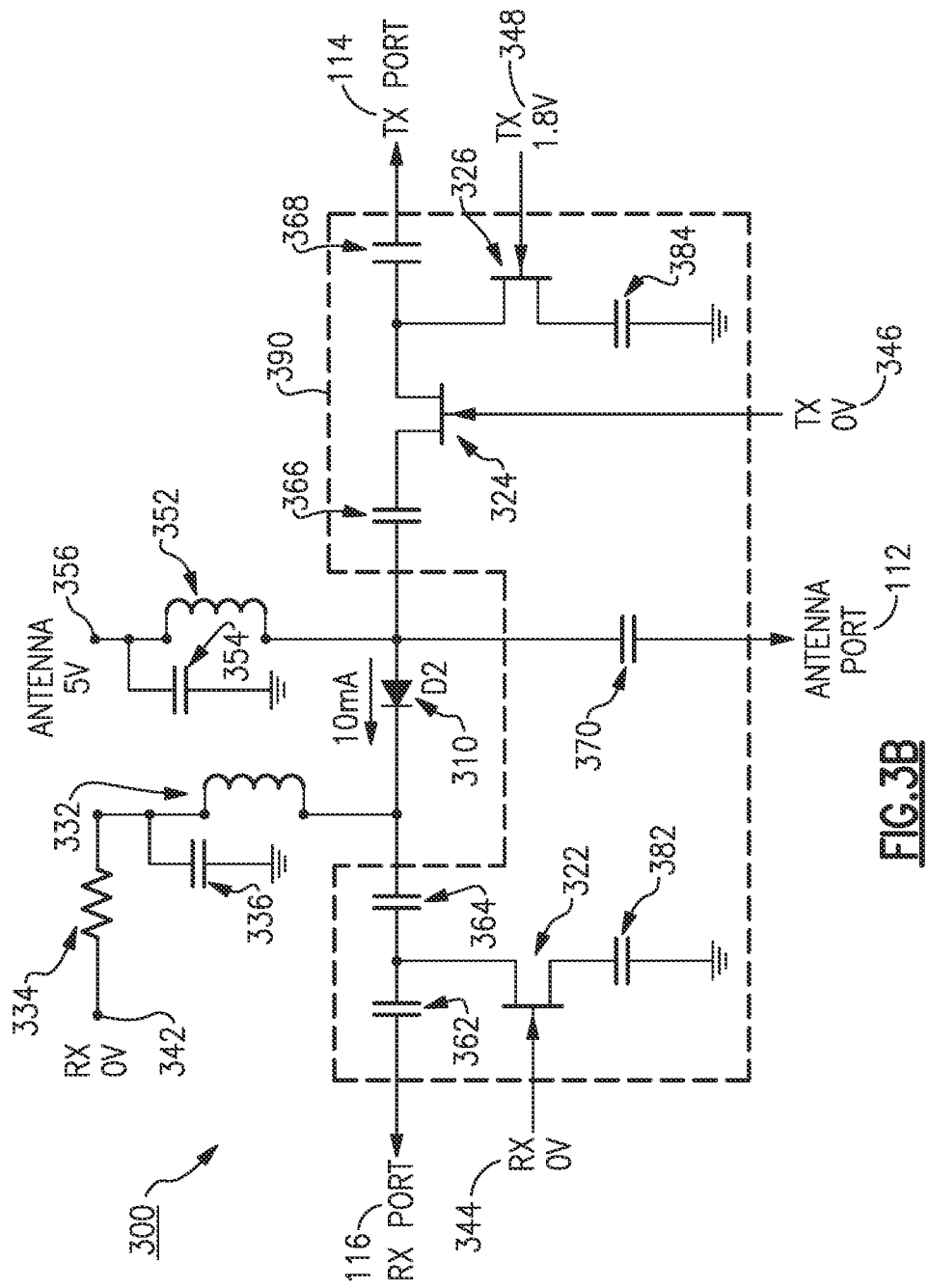

HIGH-POWER HYBRID SPDT SWITCH

CROSS-REFERENCE TO RELATED APPLICATIONS

This application claims priority under 35 U.S.C. § 119(e) to U.S. Provisional Patent Application No. 62/937,303, titled HIGH-POWER HYBRID SPDT SWITCH, filed Nov. 19, 2019, the content of which is incorporated herein in its entirety for all purposes.

BACKGROUND

There are a variety of applications in which it is necessary to switch signals having relatively high radio frequency (RF) power. For example, referring to FIG. 1, in communications systems a transmit/receive switch 110 is often used to allow a single antenna 120 to be used for both transmission and reception of RF communications signals. A typical transmit/receive switch 110 is generally a single-pole, double-throw (SPDT) switch, as shown in FIG. 1, that connects an antenna port 112 to either a transmit port 114 or a receive port 116. In certain applications, the signal power of the RF signal from the transmitter 130 is relatively high, and therefore the transmit/receive switch 110 needs to be able to both handle the high-power signal for transmission and provide sufficient isolation to protect the receiver 140 from being damaged by leakage of the high-power transmit signal into the receive path. For high power applications in excess of approximately 20 Watts, the transmit/receive switch 110 is generally implemented using PIN diodes.

Conventional high-power PIN diode transmit/receive SPDT switches suffer from numerous drawbacks. FIGS. 2A and 2B illustrate an example of a PIN diode-base switching assembly that may be used as the transmit/receive switch 110. The switching assembly includes a PIN diode switch 200 with associated bias circuitry. FIG. 2A shows the example of the switching assembly in the transmit mode (RF signal flow enabled from the transmit port to the antenna port 112) and FIG. 2B shows the example of the switching assembly in the receive mode (RF signal flow enable from the antenna port 112 to the receive port 116). The PIN diode switch 200 includes five PIN diodes D1-D5. D1 is a receive shunt diode, D2 is a receive series diode, D3 and D4 are transmit series diodes, and D5 is a transmit shunt diode. In this example, the transmit path includes the pair of PIN diodes D3, D4 for higher power handling capacity. Conventional PIN diode SPDT switches use individual bias control signals for each transmit and receive series and shunt path. Thus, as shown, the switching assembly includes a transmit series bias contact 202, a transmit shunt bias contact 204, a receive series bias contact 206, and a receive shunt bias contact 208, each configured to receive a respective bias control voltage to appropriately bias the PIN diodes to configure the switch 200 between the transmit mode and the receive mode. In the example shown in FIGS. 2A and 2B, the bias control voltages used are 28V and 0V. Thus, as shown in FIG. 2A, in the transmit mode, the receive shunt diode D1 and the transmit series diodes D3 and D4 are forward biased "ON" and the receive series diode D2 and the transmit shunt diode D5 are reversed biased "OFF" by applying 28V at the receive series bias contact 206 and the transmit shunt bias contact 204 while applying 0V at the transmit series bias contact 202 and the receive shunt bias contact 208. In this example, about 100 mA of current flows through the transmit series diodes D3 and D4, while about 10 mA of current flows through the receive shunt diode D1.

The bias control voltages are reversed to configure the switch into the receive mode, as shown in FIG. 2B. In this example, about 10 mA of current flows through each of the forward biased diodes D2 and D5. Further, in these examples, a 5V antenna bias voltage is applied at an antenna bias control contact 210.

As shown in FIGS. 2A and 2B, each bias control contact 202, 204, 206, 208 has associated bias control circuitry. For each of the transmit and receive series bias paths and each of the transmit and receive shunt bias paths, the bias control circuitry includes an inductive-capacitive-resistive network made up of an inductor 222 and a resistor 224 connected in series between the cathode of the respective diode and the respective bias control contact, and a capacitor 226 connected to ground from a node 228 between the inductor 222 and the resistor 224. Each of the transmit and receive shunt bias paths further includes an additional capacitor 232 connected between the cathode of the respective shunt PIN diode, D1, D5, and ground. The bias control circuitry for the transmit and receive series bias paths further includes a DC-blocking capacitor 234 connected in series between the cathode of the respective series PIN diodes (D2, D3, D4) and the respective transmit or receive port 114, 116 to prevent the DC bias voltage from leaking into the RF signal paths. Furthermore, the antenna port 112 and antenna bias control contact 210 have associated antenna bias control circuitry, including an inductor 222, shunt capacitor 226, and a DC blocking capacitor 234. The inductors 222 act as RF "chokes" to prevent the RF transmit or receive signals from leaking into the biasing circuitry. The inductors 222 are generally wire-wound high-Q inductors.

SUMMARY OF INVENTION

Aspects and embodiments are directed to a hybrid single-pole double throw (SPDT) transmit/receive switch, implemented using a combination of PIN diode and transistor technologies, that offers high performance in a compact package and avoids some of the drawbacks associated with pure PIN diode-based high-power switch designs.

According to an aspect of the present disclosure, a single-pole double-throw hybrid transmit/receive switch assembly is provided. The hybrid transmit/receive switch assembly comprises a PIN diode connected in series between an antenna port and a receive port, a first shunt FET device connected between the receive port and ground, a first series FET device connected between the antenna port and a transmit port, a second shunt FET device connected between the transmit port and ground, and a plurality of bias control contacts. The plurality of bias control contacts are configured to receive a corresponding plurality of bias control voltages to forward bias the first shunt FET device and the first series FET device into an ON state and to reverse bias the PIN diode and the second shunt FET device into an OFF state in a transmit mode of operation of the hybrid transmit/receive switch assembly, and to reverse bias the first shunt FET device and the first series FET device into the OFF state and to forward bias the PIN diode and the second shunt FET device into the ON state in a receive mode of operation of the hybrid transmit/receive switch assembly.

In accordance with an aspect of the present disclosure, the plurality of bias control contacts includes a receive series bias control contact, and the single-pole double-throw hybrid transmit/receive switch assembly further comprises bias control circuitry coupled between the receive series bias control contact and a cathode of the PIN diode. In accordance with one aspect, the bias control circuitry includes an inductive-capacitive-resistive network. In accordance with this aspect, the bias control circuitry may include an inductor, a resistor connected in series with the inductor between the receive series bias control contact and the cathode of the PIN diode, and a capacitor connected in shunt between ground and a node between the inductor and the resistor. In accordance with another aspect of the present disclosure, the plurality of bias control contacts further includes a receive shunt bias control contact connected to a gate of the first shunt FET device, a transmit series bias control contact connected to a gate of the first series FET device, a transmit shunt bias control contact connected to a gate of the second shunt FET device, and an antenna bias control contact coupled to the antenna port and to an anode of the PIN diode.

In accordance with a further aspect of the present disclosure, the single-pole double-throw hybrid transmit/receive switch assembly may further comprise antenna bias control circuitry connected to the antenna bias control contact, wherein the antenna bias control circuitry includes an inductive-capacitive network. In accordance with this aspect, the antenna bias control circuitry may include an inductor connected in series between the anode of the PIN diode and the antenna bias control contact, and a capacitor connected in shunt between the antenna bias control contact and ground. In some embodiments, the single-pole double-throw hybrid transmit/receive switch assembly may further comprise a DC blocking capacitor connected in series between the inductor and the antenna port.

In accordance with another aspect of the present disclosure, a single-pole double-throw hybrid transmit/receive switch assembly is provided comprising an antenna port, a transmit port, and a receive port, a receive sub-assembly, a transmit sub-assembly, and bias control circuitry. The receive sub-assembly includes a receive series switching element connected in series between the antenna port and the receive port, and a receive shunt switching element connected in shunt between the receive port and ground, the receive series switching element being a PIN diode, and the receive shunt switching element being a first FET device. The transmit sub-assembly includes a transmit series switching element connected in series between the antenna port and the transmit port, and a transmit shunt switching element connected in shunt between the transmit port and ground, the transmit series switching element being a second FET device, and the transmit shunt switching element being a third FET device. The bias control circuitry is coupled to the PIN diode and has a receive series bias control contact configured to receive a first bias control voltage to control a bias condition of the PIN diode, the first bias control voltage being switchable between zero volts and a first positive value. In accordance with an aspect of the present disclosure, the first, second, and third FET devices are implemented on a first substrate, and the PIN diode is implemented on a second substrate separate from the first substrate.

In accordance with an aspect of the present disclosure, the single-pole double-throw hybrid transmit/receive switch assembly further comprises a receive shunt bias control contact, a transmit series bias control contact, a transmit shunt bias control contact, and an antenna bias control contact. The receive shunt bias control contact is coupled to a gate of the first FET device and configured to apply a second bias control voltage to the first FET device, the second bias control voltage being switchable between zero volts and a second positive value. The transmit series bias control contact is coupled to a gate of the second FET device and configured to apply a third bias control voltage to the second FET device, the third bias control voltage being switchable between zero volts and the second positive value. The transmit shunt bias control contact is coupled to a gate of the third FET device and configured to apply a fourth bias control voltage to the third FET device, the fourth bias control voltage being switchable between zero volts and the second positive value, the second bias control voltage and the third bias control voltage being complementary with the fourth bias control voltage, such that when the second and third bias control voltages have the second positive value the fourth bias control voltage is zero volts, and when the second and third bias control voltages are zero volts the fourth bias control voltage has the second positive value. The antenna bias control contact is coupled to the antenna port and configured to receive an antenna bias control voltage having a third positive value. In accordance with an aspect of the present disclosure, the third positive value is higher than the second positive value, and the first positive value is higher than the third positive value. In accordance with another aspect of the present disclosure, the first, second, third, and fourth bias control voltages are together configured to control the bias condition of the PIN diode and a bias condition of each of the first, second, and third FET devices to operate the single-pole double-throw hybrid transmit/receive switch assembly between a transmit mode of operation in which RF signal flow is enabled from the transmit port to the antenna port and isolation is provided between the antenna port and the receive port, and a receive mode of operation in which RF signal flow is enabled from the antenna port to the receive port and isolation is provided between the antenna port and the transmit port.

In accordance with a further aspect, the single-pole double-throw hybrid transmit/receive switch assembly further comprises antenna bias control circuitry coupled to the antenna bias control contact. In accordance with one embodiment, the antenna bias control circuitry includes an inductor connected in series between an anode of the PIN diode and the antenna bias control contact, and a capacitor connected in shunt between the antenna bias control contact and ground. In accordance with a further aspect, the single-pole double-throw hybrid transmit/receive switch assembly may further comprise bias control circuitry coupled between the receive series bias control contact and a cathode of the PIN diode, the bias control circuitry including an inductive-capacitive-resistive network. In one embodiment, the bias control circuitry includes an inductor, a resistor connected in series with the inductor between the receive series bias control contact and the cathode of the PIN diode, and a capacitor connected in shunt between ground and a node between the inductor and the resistor.

In accordance with another aspect of the present disclosure, a hybrid transmit/receive switching assembly is provided comprising an antenna port, a transmit port, and a receive port; a plurality of FET devices implemented on a first substrate, each FET device of the plurality of FET devices configured to receive a respective first bias control signal; a PIN diode implemented on a second substrate separate from the first substrate and having a cathode coupled to the receive port and an anode coupled to each of the antenna port and the transmit port; and bias control circuitry coupled to the PIN diode. The bias control circuitry is configured to receive a second bias control signal, each respective first bias control signal and the second bias control signal are together configured to operate the hybrid transmit/receive switching assembly between a transmit mode in which the PIN diode is reverse biased, RF signal flow is enabled from the transmit port to the antenna port, and isolation is provided between the antenna port and the receive port, and a receive mode in which the PIN diode is forward biased, RF signal flow is enabled from the antenna port to the receive port, and isolation is provided between the antenna port and the transmit port.

In accordance with one aspect, the plurality of FET devices includes a first FET device coupled between the receive port and ground, a second FET device coupled between the antenna port and the transmit port, and a third FET device coupled between the transmit port and ground. In accordance with this aspect, each respective first bias control signal is switchable between zero volts and a first positive voltage value, and wherein when the respective first bias control signal applied to each of the first and second FET devices has the first positive voltage value, the respective first bias control signal applied to the third FET device is zero volts. In accordance with a further aspect, the bias control circuitry includes an inductor, a resistor connected in series with the inductor between the receive series bias control contact and the cathode of the PIN diode, and a capacitor connected in shunt between ground and a node between the inductor and the resistor.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 3B is a diagram showing the hybrid switch of FIG. 3A configured for the receive mode; according to aspects of the present invention.

DETAILED DESCRIPTION

Figure 1:
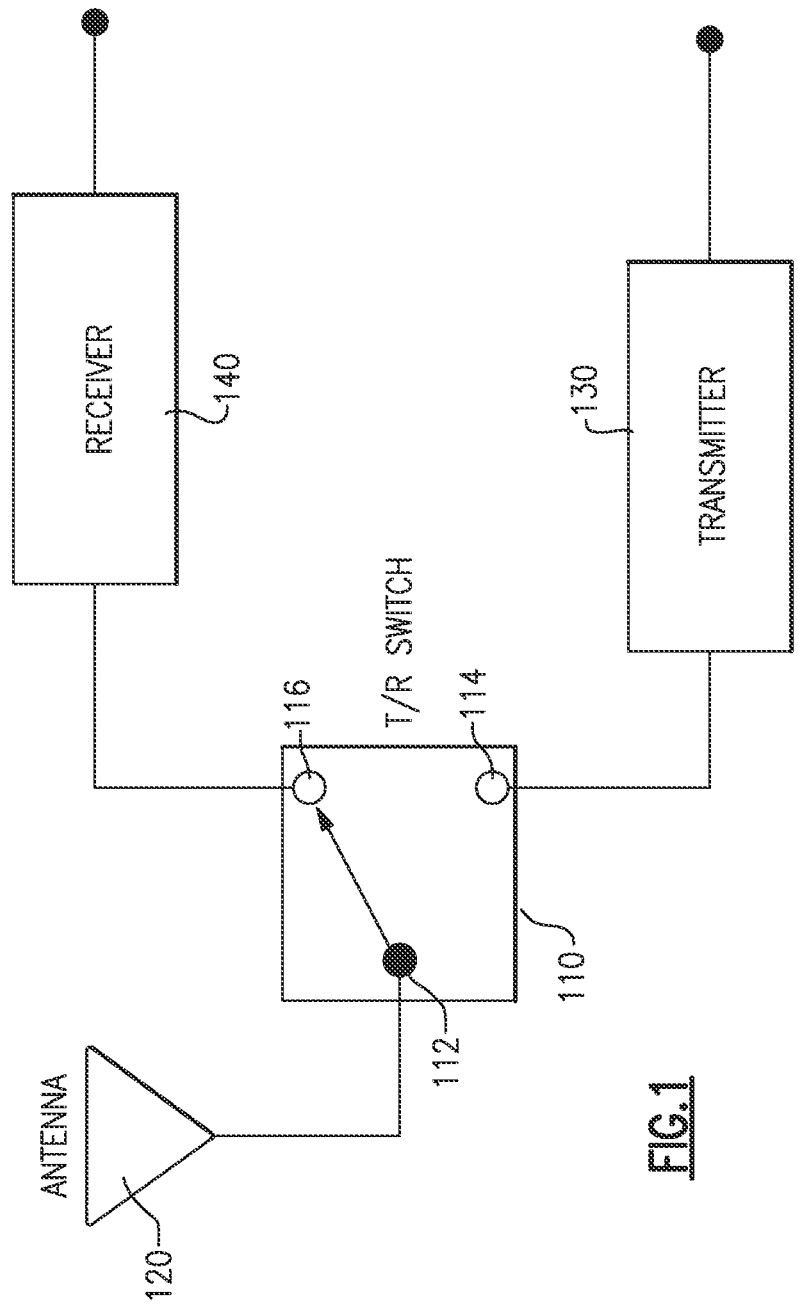
FIG. 1 is a block diagram of a portion of an RF front-end module including a transmit/receive switch.
Figure 2A:
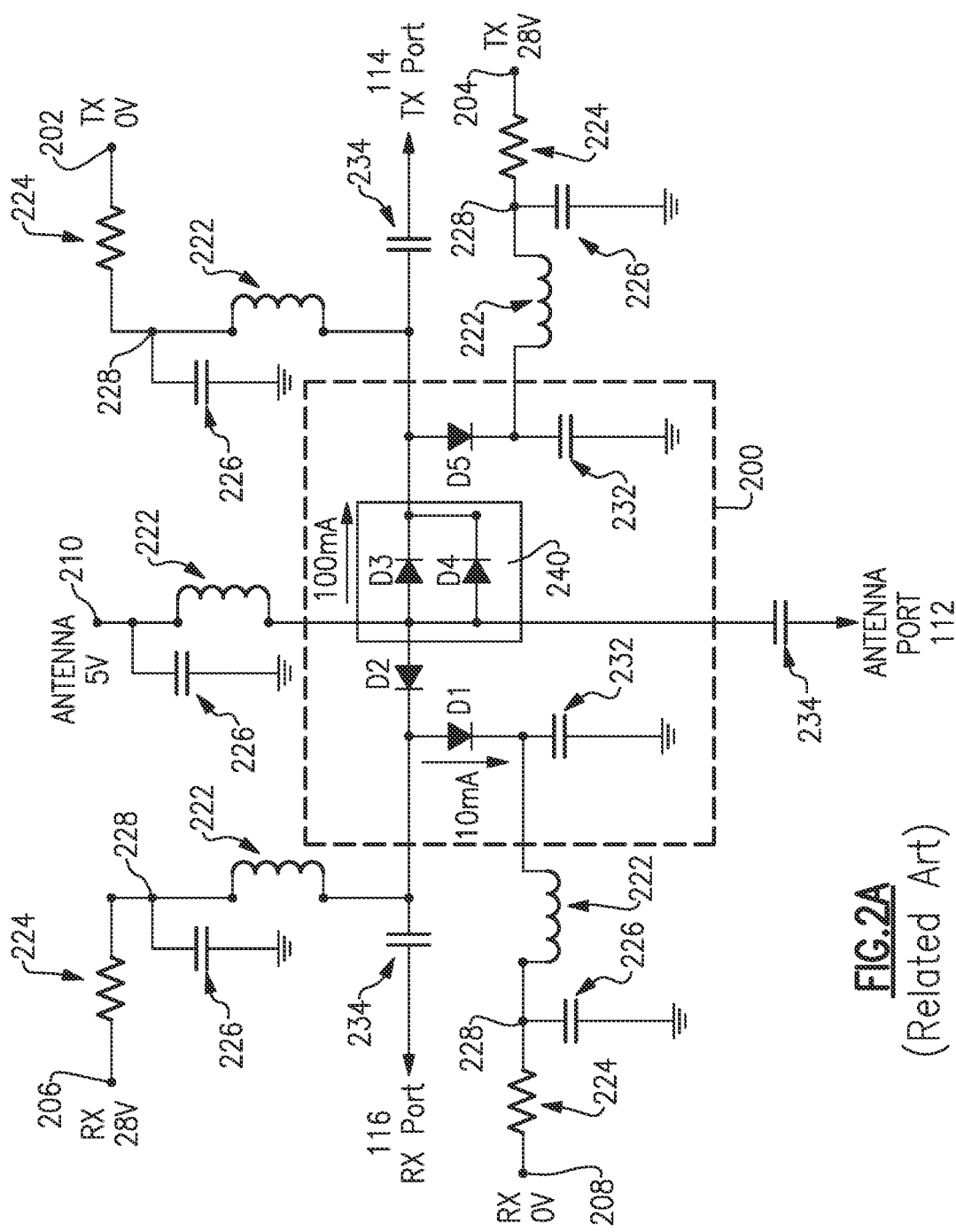
FIG. 2A is a diagram of one example of the transmit/receive switch of FIG. 1 implemented using PIN diodes, shown configured for the transmit mode.
Figure 2B:
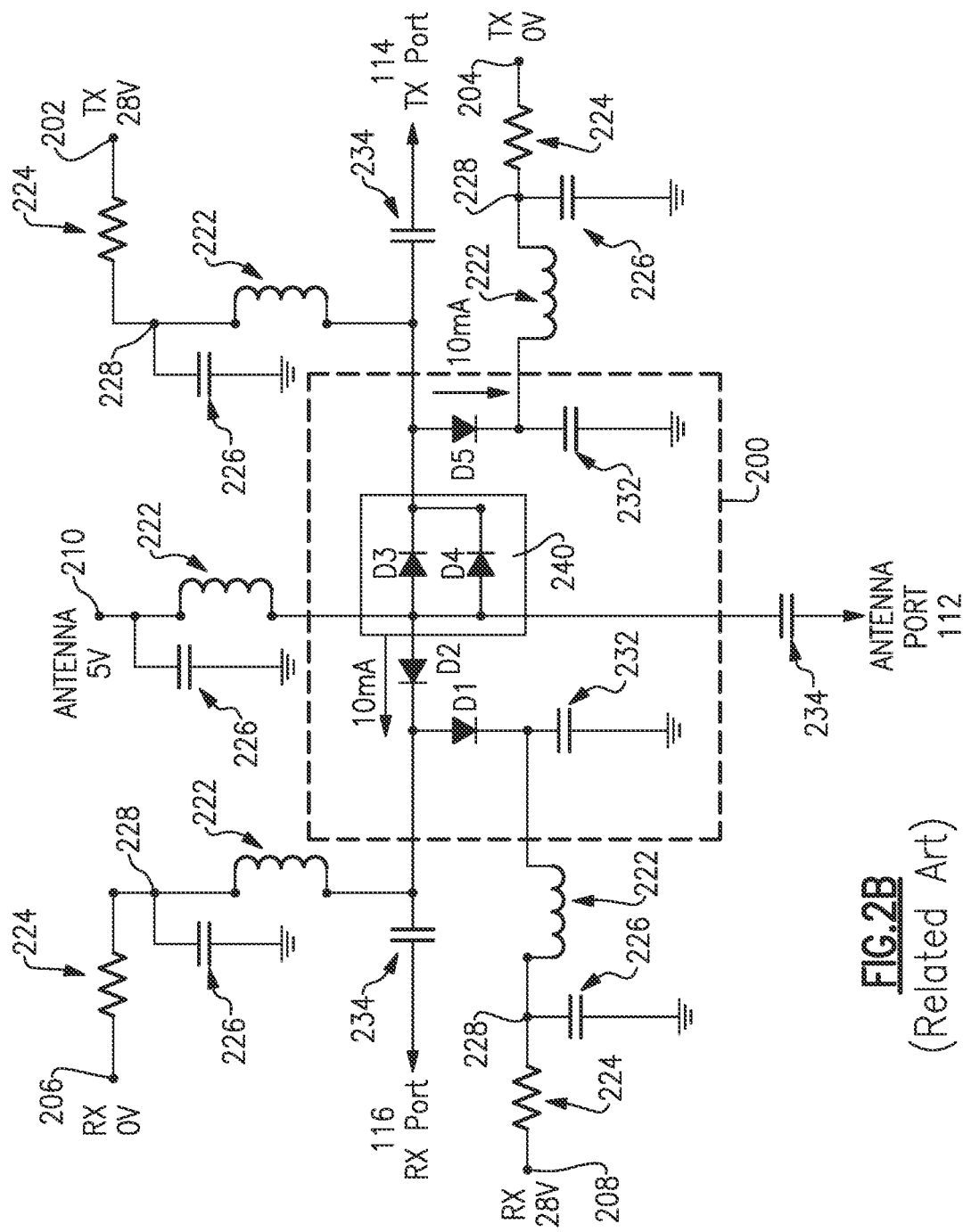
FIG. 2B is a diagram showing the PIN diode switch of FIG. 2A configured for the receive mode.

Communications systems, such as cellular infrastructure Long-Term Evolution (LTE) Time Division Duplex (TDD) base stations and similar systems use single-pole, double-throw (SPDT) switches to switch between transmit and receive modes using a common RF antenna. In many applications, these transmit/receive switches must be capable of handling high-power RF signals and have fast switching speeds. As noted above, conventional PIN diode-based transmit/receive switches have numerous drawbacks. For example, as shown in FIGS. 2A and 2B, the bias control circuitry associated with each PIN diode D1-D5 results in a need for a large number of external (to the switch 200) components, including discrete inductors, capacitors, and resistors, which adds significantly to the component count of the transmit/receive switch, requiring more circuit board space and adding cost. In addition, the transmit series PIN diodes D3 and D4 typically must be mounted on a separate substrate with an enhanced thermal interface for cooling to be able to handle the high current flow through these diodes in the transmit mode. This adds further cost and complexity to the design.

Aspects and embodiments provide a hybrid transmit/receive switch design that may overcome certain disadvantages associated with conventional high-power transmit/receive switches and offers a compact, cost-effective, and high-performance solution that may be suitable for a wide range of applications, including advanced communications architectures, such as 5G or 5GE systems. As discussed in more detail below, embodiments of the hybrid transmit/receive switch include a PIN diode in receive series path, with the receive shunt path and the transmit paths (series and shunt) being implemented using field effect transistor (FET) devices. Embodiments of the hybrid transmit/receive switch may offer fast switching with low power consumption and minimal space allocation, and may overcome the disadvantages such as excessive current consumption and large biasing component count (leading to large circuit footprint) associated with pure PIN diode-based high-power switch designs. In addition, the use of a PIN diode in the receive path of the hybrid transmit/receive switch may avoid drawbacks such as high insertion loss and poor settling and response times associated with high-power pure silicon-on-insulator (SOI) or gallium-arsenide (GaAs) pHEMT switches. This may be particularly important on the receive side of the switch where low insertion loss at high frequencies may be critical for maintaining a low noise figure.

Figure 3A:
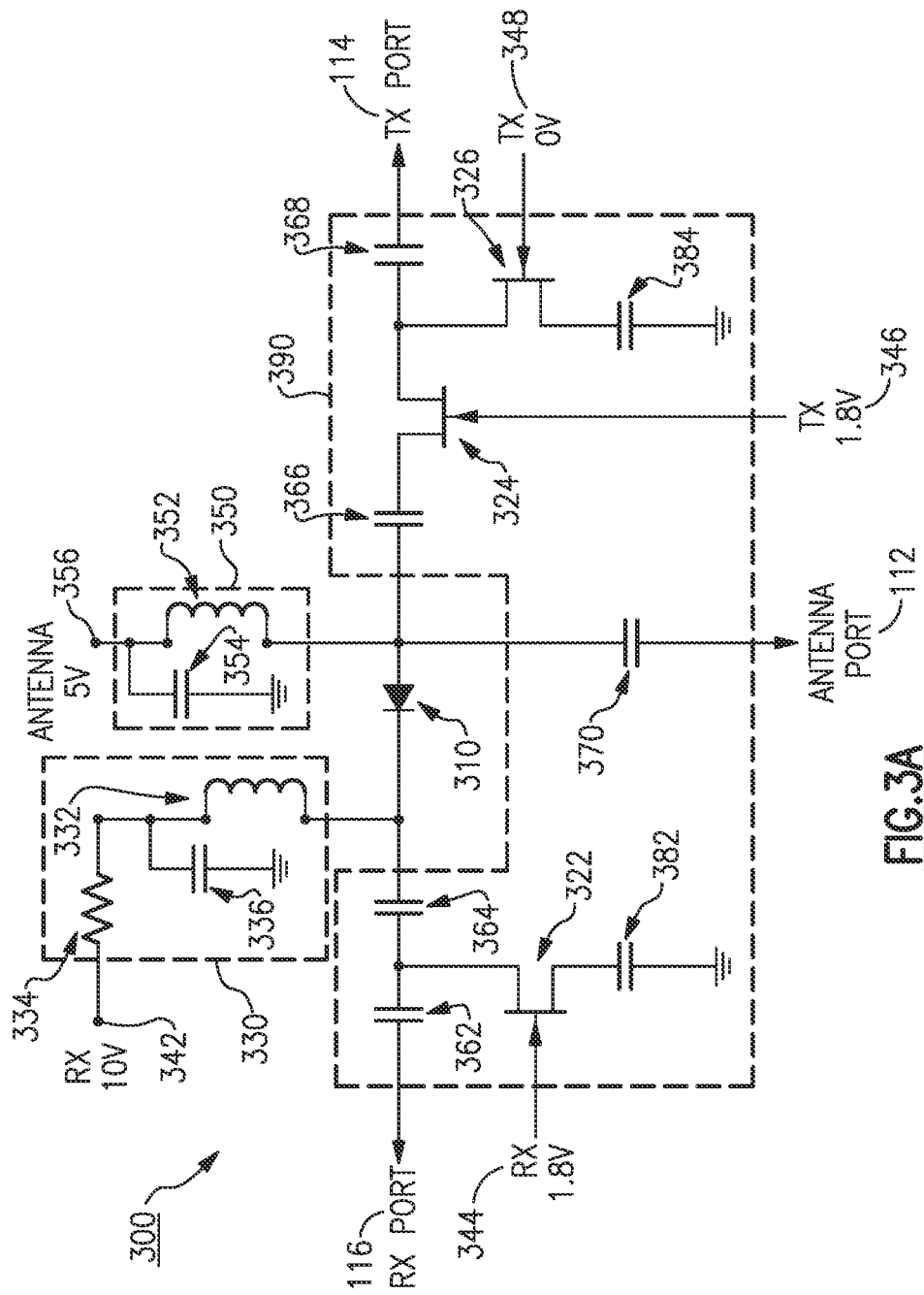
FIG. 3A is a diagram of one example of a hybrid transmit/receive switch and associated bias control circuitry, shown configured for the transmit mode, according to aspects of the present invention.

Referring to FIGS. 3A and 3B, there is illustrated an example of a hybrid transmit/receive switch architecture according to certain embodiments. FIG. 3A shows the hybrid switch with bias control signals configured for the transmit mode (RF signal flow from the transmit port 114 to the antenna port 112), and FIG. 3B shows the hybrid switch with bias control signals configured for the receive mode (RF signal flow from the antenna port 112 to the receive port 116). As discussed above, according to certain embodiments, the hybrid switch 300 includes a PIN diode 310 in the series receive path connected between the antenna port 112 and the receive port 116. The "ON" resistance of the PIN diode 310 may be controlled by current and may minimize the insertion loss of the switch 300, having minimal impact on the noise figure. The shunt section of the receive side of the hybrid switch 300 may be realized with a first FET device 322 that consumes little to no current in the transmit mode of operation. The transmit side of the hybrid switch may be fully realized with FET devices (including a second FET device 324 and a third FET device 326, as shown in FIGS. 3A and 3B) for low power consumption and minimal space allocation, as discussed further below.

The PIN diode 310 has associated bias control circuitry 330 coupled between the cathode of the PIN diode 310 and a receive series bias control contact 342. In the illustrated example, the bias control circuitry 330 includes an inductive-capacitive-resistive network made up of an inductor 332 and a resistor 334 connected in series between the cathode of the PIN diode 310 and the receive series bias control contact 342, and a capacitor 336 connected to ground from a node between the inductor 332 and the resistor 334. In certain examples, the antenna port 112 may also have associated external bias control circuitry 350. In the example shown in FIGS. 3A and 3B, the antenna bias control circuitry 350 includes a series inductor 352 and a shunt capacitor 354. However, the FET devices 322, 324, 326 may be directly biased without the need for external bias control circuitry. As shown in FIGS. 3A and 3B, a receive shunt bias control contact 344 is connected to a gate of the first FET device 322, a transmit series bias control contact 346 is connected to a gate of the second FET device 324, and a transmit shunt bias control contact 348 is connected to a gate of the third FET device 326. Thus, through the use of the FET devices 322, 324, 326 to replace some of the PIN diodes, the biasing component count is significantly reduced relative to a pure PIN diode-based design, such as that shown in FIGS. 2A and 2B. This may significantly reduce the cost of the transmit/receive switch as well as the circuit board space needed to accommodate the transmit/receive switch.

Operation of the hybrid switch 300 shown in FIGS. 3A and 3B may be understood as follows. A fixed antenna bias voltage is applied at an antenna bias control contact 356. In the illustrated example, the antenna bias voltage is 5V; however, those skilled in the art will appreciate that a different voltage value may be used in other examples. Referring to FIG. 3A, for transmit operation, a first positive bias voltage is applied to the gate of the second FET device 324 via the transmit series bias control contact 346, while 0V is applied at the gate of the third FET device 326 via the transmit shunt bias control contact 348. Thus, the second FET device 324, which acts as the transmit series switching element, is biased "ON" while the third FET device 326, which acts as the transmit shunt switching element, is biased OFF, to allow RF signal flow from the transmit port 114 to the antenna port 112. At the same time, the PIN diode 310 is reverse biased "OFF" by applying a high bias voltage at the receive series bias control contact 342, while a second positive bias voltage is applied to the gate of the first FET device 322 via the receive shunt bias control contact 344 to bias the first FET device "ON," so as to provide isolation between the antenna port 112 and the receive port 116. In the illustrated example, the high bias voltage applied to reverse bias the PIN diode 310 is 10V; however, those skilled in the art will appreciate that other voltage values may be used, provided that the bias voltage applied at the receive series bias control contact 342 is higher than the antenna bias voltage and sufficiently high to reverse bias the PIN diode 310 fully OFF through any RF signal voltage swings that may occur during the transmit mode. Further, in the illustrated example, the first and second positive bias voltages applied to the gates of the third FET device 326 and the first FET device 322, respectively, are 1.8V; however, in other examples, other voltage values may be used.

Referring to FIG. 3B, for receive operation, the bias voltages applied to the gates of the first, second, and third FET devices 322, 324, 326 are reversed. That is, 0V is applied to gates of the first FET device 322 and the second FET device 324 to bias these devices "OFF," disabling the receive shunt path and the transmit series path, and a positive bias voltage (1.8V in the illustrated example) is applied to the gate of the third FET device 326 to enable the transmit shunt path, thereby providing isolation between the antenna port 112 and the transmit port 114. At the same time, 0V is applied at the receive series bias control contact 342 to bias the PIN diode 310 "ON" and enable RF signal flow from the antenna port 112 to the receive port 116. As may be noted with reference to FIGS. 2A, 2B, 3A, and 3B, in certain examples, biasing of the hybrid switch 300 may be accomplished using significantly lower DC voltages than may be required to properly bias the pure PIN diode-based conventional switch 200. This may be advantageous in terms of lowering circuit current consumption, reducing power requirements, and/or allowing biasing components to be made smaller and therefore consume less circuit board space.

In the bias control circuitry 330 for the PIN diode 310 and in the antenna bias control circuitry 350, the inductors 332, 352 act as RF chokes to prevent transmit or receive RF signals from leaking to the bias control contacts 342, 356, respectively. The inductors 332, 352 may be wire-wound high-Q inductors, for example. DC blocking capacitors 362, 364, 366, 368, and 370 may be included in the receive and transmit paths, as shown in FIGS. 3A and 3B, to prevent the DC bias control voltages from leaking into the RF signal paths. Those skilled in the art will appreciate that any of the inductors 332, 352, capacitors 336, 354, 362, 364, 366, 368, 370 and resistor 334 may be implemented in practice using one or more discrete or lumped elements.

By appropriately selecting the PIN diode 310, having a thin I region yet capable of blocking the RF transmitted power when reverse biased, the response time of the hybrid switch 300 can be fast. As discussed above, reverse biasing of the PIN diode 310 may be accomplished by providing a relatively high DC voltage at the receive series bias control contact 342. In certain examples, the receive series bias control contact 342 may be coupled to a high voltage rail. In other examples, a voltage doubling or tripling circuit may be used to raise the DC voltage applied to the receive series bias control contact 342. The shunt section of the receive sub-assembly of the hybrid switch 300, implemented using the first FET device 322, may be small in periphery (i.e., have minimal associated components; e.g., only the DC blocking capacitors 362, 364, as the need for external biasing circuitry is removed) and have an inherently fast switching time. In particular, it may be highly desirable that the hybrid switch 300 be capable of very fast switching from the receive mode to the transmit mode to block high-power RF transmit signals from reaching and damaging sensitive receiver components (e.g., a low noise amplifier). Thus, the use of the first FET device 322 in the receive sub-assembly of the hybrid switch 300 may provide advantages of the desired very fast switching time, relatively low bias voltages, and compact package size through the reduced requirement for external associated components. The use of the PIN diode 310 in the receive sub-assembly of the switch 300 offers the advantage of low insertion loss, particularly at high frequencies, to maintain a low noise figure for the receiver, and avoids problems of poor settling and response time (as well as high insertional loss) associated with conventional purely FET-based switches. For example, the selection of the PIN diode 310 with a thin I region may enhance the switching/settling time relative to a purely FET-based switch design.

Each of the first, second, and third FET devices 322, 324, 326 may include one or more individual transistors. In the transmit sub-assembly of embodiments of the hybrid switch 300, the second FET device 324, forming the transmit series switching element, may be a relatively small device; in other words, including a relatively low number of individual transistors. The power handling capability of the second FET device 324 may be determined by the insertion loss or "on-resistance" of this device and configured so as not to exceed the maximum junction temperature for a given implementation. In certain examples, the third FET device 326, forming the transmit shunt switching element, may need to be a fairly large device, including several stacked transistors, so as not to exceed the breakdown of the transistors used under the highest operating power levels. Although not shown in FIGS. 3A and 3B, in certain examples, to respond and settle rapidly between the transmit mode and the receive mode, the transmit sub-assembly of the hybrid switch 300 can incorporate "speed up" circuitry configured to lower gate resistance during the transition phases of the pulse between the transmit and receive states. The second and third FET devices 324, 326 may each be grounded via a capacitor 382, 384, respectively, as shown in FIGS. 3A and 3B.

According to certain embodiments, the first, second, and third FET devices 322, 324, 326 may be implemented on a silicon or other substrate 390 forming a switching die. The capacitors 362, 365, 366, 368, 370, 382, and 384 may be integrated with the FET devices 322, 324, 326 on the substrate 390. The PIN diode 310 may be located "off-die," that is, not on the substrate 390, but rather on a separate substrate (not shown). However, because the PIN diode 310 is used in the receive sub-assembly of the hybrid switch 300, no additional thermal interface may be required for cooling. This may significantly lower the associated cost relative to a conventional high-power fully realized PIN diode switch, which requires exotic materials under the diodes in the transmit section to provide an adequate thermal path for the transmit series device.

Thus, aspects and embodiments provide a hybrid transmit/receive switch topology that offers numerous advantages and improvements over conventional transmit/receive switches and which is suitable for high-power, high-frequency applications, including, but not limited to, newer 5GE and 5G communications systems. Embodiments of the hybrid switch 300 may offer a combination of the best technologies and switch design topologies. For example, embodiments of the hybrid switch 300 may offer the high performance of the PIN diode 310 in the receive sub-assembly for fast switching and lower insertion loss, while also providing the high level of integration and low cost and current consumption of a FET-based switch. Further, as discussed above, embodiments of the hybrid switch 300 may use a reduced number of external biasing components relative to conventional switches, thereby saving circuit board space and cost.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, it is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Thus, the foregoing description and drawings are by way of example only, and the scope of the invention should be determined from proper construction of the appended claims, and their equivalents.

What is claimed is:

1. A single-pole double-throw hybrid transmit/receive switch assembly comprising:
   a PIN diode having an anode and a cathode and connected in series between an antenna port and a receive port;
   a first shunt FET device coupled to the cathode of the PIN diode and connected between the receive port and ground;
   a first series FET device coupled to the anode of the PIN diode and connected between the antenna port and a transmit port;
   a second shunt FET device connected between the transmit port and ground; and
   a plurality of bias control contacts including a receive series bias control contact, a transmit series bias control contact, a receive shunt bias control contact, and a transmit shunt bias control contact, the plurality of bias control contacts being configured to receive a corresponding plurality of bias control voltages to forward bias the first shunt FET device and the first series FET device into an ON state and to reverse bias the PIN diode and the second shunt FET device into an OFF state in a transmit mode of operation of the hybrid transmit/receive switch assembly, and to reverse bias the first shunt FET device and the first series FET device into the OFF state and to forward bias the PIN diode and the second shunt FET device into the ON state in a receive mode of operation of the hybrid transmit/receive switch assembly.

2. The single-pole double-throw hybrid transmit/receive switch assembly of claim 1 further comprising bias control circuitry coupled between the receive series bias control contact and the cathode of the PIN diode.

3. The single-pole double-throw hybrid transmit/receive switch assembly of claim 2 wherein the bias control circuitry includes an inductive-capacitive-resistive network.

4. The single-pole double-throw hybrid transmit/receive switch assembly of claim 3 wherein the bias control circuitry includes:
   an inductor;
   a resistor connected in series with the inductor between the receive series bias control contact and the cathode of the PIN diode; and
   a capacitor connected in shunt between ground and a node between the inductor and the resistor.

5. The single-pole double-throw hybrid transmit/receive switch assembly of claim 2 wherein:
   the receive shunt bias control contact is connected to a gate of the first shunt FET device;
   the transmit series bias control contact connected to a gate of the first series FET device;
   the transmit shunt bias control contact connected to a gate of the second shunt FET device; and wherein the plurality of bias control contacts further includes an antenna bias control contact coupled to the antenna port and to the anode of the PIN diode.

6. The single-pole double-throw hybrid transmit/receive switch assembly of claim 5 further comprising antenna bias control circuitry connected to the antenna bias control contact, wherein the antenna bias control circuitry includes an inductive-capacitive network.

7. The single-pole double-throw hybrid transmit/receive switch assembly of claim 6 wherein the antenna bias control circuitry includes:
   an inductor connected in series between the anode of the PIN diode and the antenna bias control contact; and
   a capacitor connected in shunt between the antenna bias control contact and ground.

8. The single-pole double-throw hybrid transmit/receive switch assembly of claim 7 further comprising a DC blocking capacitor connected in series between the inductor and the antenna port.

9. A single-pole double-throw hybrid transmit/receive switch assembly comprising:
   an antenna port, a transmit port, and a receive port;
   a receive sub-assembly including a receive series switching element connected in series between the antenna port and the receive port, and a receive shunt switching element connected in shunt between the receive port and ground, the receive series switching element being a PIN diode, and the receive shunt switching element being a first FET device;
   a transmit sub-assembly including a transmit series switching element connected in series between the antenna port and the transmit port, and a transmit shunt switching element connected in shunt between the transmit port and ground, the transmit series switching element being a second FET device, and the transmit shunt switching element being a third FET device; and
   bias control circuitry coupled to a cathode of the PIN diode and having a receive series bias control contact configured to receive a first bias control voltage to control a bias condition of the PIN diode, the first bias control voltage having a voltage value that is one of zero volts and a first positive value.

10. The single-pole double-throw hybrid transmit/receive switch assembly of claim 9 wherein the first, second, and third FET devices are implemented on a first substrate, and the PIN diode is implemented on a second substrate separate from the first substrate.

11. The single-pole double-throw hybrid transmit/receive switch assembly of claim 10 further comprising:
   a receive shunt bias control contact coupled to a gate of the first FET device and configured to apply a second bias control voltage to the first FET device, the second bias control voltage having a voltage value that is one of zero volts and a second positive value;
   a transmit series bias control contact coupled to a gate of the second FET device and configured to apply a third bias control voltage to the second FET device, the third bias control voltage having a voltage value that is one of zero volts and the second positive value;
   a transmit shunt bias control contact coupled to a gate of the third FET device and configured to apply a fourth bias control voltage to the third FET device, the fourth bias control voltage having a voltage value that is one of zero volts and the second positive value, the second bias control voltage and the third bias control voltage being complementary with the fourth bias control voltage, such that when the second and third bias control voltages have the second positive value the fourth bias control voltage is zero volts, and when the second and third bias control voltages are zero volts the fourth bias control voltage has the second positive value; and
   an antenna bias control contact coupled to the antenna port and configured to receive an antenna bias control voltage having a third positive value.

12. The single-pole double-throw hybrid transmit/receive switch assembly of claim 11 wherein the third positive value is higher than the second positive value, and the first positive value is higher than the third positive value.

13. The single-pole double-throw hybrid transmit/receive switch assembly of claim 11 wherein the first, second, third, and fourth bias control voltages are together configured to control the bias condition of the PIN diode and a bias condition of each of the first, second, and third FET devices to operate the single-pole double-throw hybrid transmit/receive switch assembly between a transmit mode of operation in which RF signal flow is enabled from the transmit port to the antenna port and isolation is provided between the antenna port and the receive port, and a receive mode of operation in which RF signal flow is enabled from the antenna port to the receive port and isolation is provided between the antenna port and the transmit port.

14. The single-pole double-throw hybrid transmit/receive switch assembly of claim 11 further comprising:
   antenna bias control circuitry coupled to the antenna bias control contact.

15. The single-pole double-throw hybrid transmit/receive switch assembly of claim 14 wherein the antenna bias control circuitry includes:
   an inductor connected in series between an anode of the PIN diode and the antenna bias control contact; and
   a capacitor connected in shunt between the antenna bias control contact and ground.

16. The single-pole double-throw hybrid transmit/receive switch assembly of claim 11 further comprising bias control circuitry coupled between the receive series bias control contact and the cathode of the PIN diode, the bias control circuitry including an inductive-capacitive-resistive network.

17. The single-pole double-throw hybrid transmit/receive switch assembly of claim 16 wherein the bias control circuitry includes:
   an inductor;
   a resistor connected in series with the inductor between the receive series bias control contact and the cathode of the PIN diode; and
   a capacitor connected in shunt between ground and a node between the inductor and the resistor.

18. A hybrid transmit/receive switching assembly comprising:
   an antenna port, a transmit port, and a receive port;
   a plurality of FET devices implemented on a first substrate, each FET device of the plurality of FET devices configured to receive a respective first bias control signal and including a first FET device coupled between the receive port and ground, a second FET device coupled between the antenna port and the transmit port, and a third FET device coupled between the transmit port and ground;
   a PIN diode implemented on a second substrate separate from the first substrate and having a cathode coupled to the receive port and an anode coupled to each of the antenna port and the transmit port; and
   bias control circuitry coupled to the PIN diode and configured to receive a second bias control signal, each respective first bias control signal and the second bias control signal together configured to operate the hybrid transmit/receive switching assembly between a transmit mode in which the PIN diode is reverse biased, RF signal flow is enabled from the transmit port to the antenna port, and isolation is provided between the antenna port and the receive port, and a receive mode in which the PIN diode is forward biased, RF signal flow is enabled from the antenna port to the receive port, and isolation is provided between the antenna port and the transmit port.

19. The hybrid transmit/receive switching assembly of claim 18 wherein each respective first bias control signal is switchable between zero volts and a first positive voltage value, and wherein when the respective first bias control signal applied to each of the first and second FET devices has the first positive voltage value, the respective first bias control signal applied to the third FET device is zero volts.

20. The hybrid transmit/receive switching assembly of claim 18 wherein the bias control circuitry includes:
   an inductor;
   a resistor connected in series with the inductor between the receive series bias control contact and the cathode of the PIN diode; and
   a capacitor connected in shunt between ground and a node between the inductor and the resistor.

\* \* \* \* \*